(12) United States Patent
Mowry et al.

(10) Patent No.: US 7,879,667 B2
(45) Date of Patent: Feb. 1, 2011

(54) BLOCKING PRE-AMORPHIZATION OF A GATE ELECTRODE OF A TRANSISTOR

(75) Inventors: Anthony Mowry, Dresden (DE); Markus Lenski, Dresden (DE); Andy Wei, Dresden (DE); Roman Boschke, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 99 days.

(21) Appl. No.: 12/026,273

(22) Filed: Feb. 5, 2008

(65) Prior Publication Data

US 2009/0001371 A1 Jan. 1, 2009

(30) Foreign Application Priority Data

Jun. 29, 2007 (DE) .................. 10 2007 030 056

(51) Int. Cl.
*H01L 21/8238* (2006.01)
(52) U.S. Cl. .............. 438/199; 438/520; 438/528; 257/E27.064; 257/E27.108; 257/E21.632
(58) Field of Classification Search .............. 438/199, 438/520, 528; 257/E27.064, E27.108, E21.632
See application file for complete search history.

(56) References Cited

U.S. PATENT DOCUMENTS

| 5,845,099 | A | 12/1998 | Krishnamurthy et al. .... 395/380 |
| 5,948,096 | A | 9/1999 | Ginosar et al. .............. 712/210 |
| 6,180,476 | B1* | 1/2001 | Yu .............................. 438/305 |
| 6,265,293 | B1* | 7/2001 | Yu .............................. 438/528 |
| 6,335,253 | B1* | 1/2002 | Chong et al. ................ 438/305 |
| 6,355,543 | B1* | 3/2002 | Yu .............................. 438/535 |
| 6,372,591 | B1* | 4/2002 | Mineji et al. ................ 438/305 |
| 7,494,906 | B2* | 2/2009 | Kammler et al. ........... 438/528 |
| 2003/0207542 | A1* | 11/2003 | Chidambaram et al. ..... 438/305 |
| 2007/0252205 | A1* | 11/2007 | Hoentschel et al. ......... 257/347 |
| 2007/0254444 | A1* | 11/2007 | Bloomquist et al. ......... 438/305 |
| 2008/0026572 | A1* | 1/2008 | Wirbeleit et al. ............ 438/663 |

FOREIGN PATENT DOCUMENTS

| EP | 1 524 699 A1 | 4/2005 |
| WO | WO 00/26769 | 5/2000 |
| WO | WO 2007/035398 A2 | 3/2007 |

OTHER PUBLICATIONS

Translation of Official Communication from German Patent Office for German Patent Application No. 10 2007 030 056.7-33 dated Feb. 29, 2008.
PCT Search Report from PCT/US2008/008152 dated Oct. 6, 2008.

* cited by examiner

*Primary Examiner*—Michelle Estrada
(74) *Attorney, Agent, or Firm*—Williams, Morgan & Amerson, P.C.

(57) ABSTRACT

A technique is presented which provides for a selective pre-amorphization of source/drain regions of a transistor while preventing pre-amorphization of a gate electrode of the transistor. Illustrative embodiments include the formation of a pre-amorphization implant blocking material over the gate electrode. Further illustrative embodiments include inducing a strain in a channel region by use of various stressors.

29 Claims, 8 Drawing Sheets

BLOCKING PRE-AMORPHIZATION OF A GATE ELECTRODE OF A TRANSISTOR

BACKGROUND OF THE INVENTION

1. Field of the Invention

Generally, the present disclosure relates to the formation of integrated circuits, and, more particularly, to the formation of a transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source regions.

The conductivity of the channel region, i.e., the drive current capability of the conductive channel, is controlled by a gate electrode formed close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions in order to provide low sheet and contact resistivity in combination with a desired channel controllability. In addition, the vertical location of the PN junctions with respect to the gate insulation layer also represents a critical design criterion in view of leakage current control. Hence, reducing the channel length may usually also require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Another approach is the formation of deeper source/drain regions which allow reliable silicidation and hence the formation of a low resistance contact while providing shallow source/drain extensions between the deeper source/drain regions and the gate.

Dopant profiles are usually obtained by ion implantation techniques. Ion implantation is essential to the fabrication of modern integrated circuits. Ion implantation involves generating the required beam of ions and implanting them into the substrate so that they come to rest just below the semiconductor surface. Currently, ion implantation is used to form source and drain regions, shallow extension junctions between the channel and the source/drain contacts, and electrically active polysilicon gate electrodes. Ion implantation is usually followed by an annealing step to heal the damage that occurs when ions occupy the interstitial spaces in the semiconductor crystal lattice during implanting.

As transistor devices are scaled down below 100 nm, highly doped ultra-shallow junctions are necessary for high current drive capability with acceptable short-channel performance. It is believed that a critical parameter for reducing the resistance of the source/drain extension junction is the dopant diffusion slope, rather than its maximum doping level. Hence, the development of an advanced process technology for achieving a box-shaped profile appears to be an efficient way to sustain lower junction resistance.

With the conventional junction formation by ion implantation and rapid thermal anneal, it is very difficult to obtain highly steep ultra-shallow junction profiles because the interaction between implantation-induced point defects and dopant atoms during annealing can considerably broaden the profile shape, i.e., reduce the slope of the profile. Laser thermal annealing with pre-amorphization implant (PAI) has received considerable attention as a potential solution to achieve low-resistance, ultra-shallow box-shaped source/drain extension junctions.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance, by creating tensile or compressive stress in the vicinity of the channel region to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow for forming the germanium- or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. Although being a promising approach, the process of creating the strain in the channel region by applying a specified external stress may depend on the efficiency of the stress transfer mechanism for the external stress provided, for instance, by contact layers, spacers and the like into the channel region to create the desired strain therein. Hence, although providing significant advantages over the above-discussed approach requiring additional stress layers within the channel region, the efficiency of the stress transfer mechanism may depend on the process and device specifics and may result in a reduced performance gain for one type of transistor.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked, and subsequently the silicon/germanium layer is selectively formed in the PMOS transistor by epitaxial growth. In a similar way, the electron mobility of NMOS transistors is enhanced by forming a straining silicon/carbon layer in the drain and source regions of the transistors, wherein the tensile strained drain and source regions create a uniaxial tensile strain in the adjacent silicon channel region. Although this technique offers significant advantages in view of performance gain of the PMOS transistor and thus of the entire CMOS device, an appropriate design may have to be used that balances the difference in performance gain of the PMOS transistor and the NMOS transistor.

The present disclosure is directed to various structures and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique that enables the formation of a transistor, during the manufacture of which source/drain regions are at least in part pre-amorphized, whereas a gate electrode is not pre-amorphized.

One illustrative method comprises providing a substrate, the substrate having a gate electrode of a transistor with a pre-amorphization implant blocking material over the gate electrode. The substrate further comprises source/drain regions of the transistor that are free of the pre-amorphization implant blocking material. The substrate is subjected to a pre-amorphization implant process to thereby pre-amorphize at least part of the source/drain regions while blocking the gate electrode from the pre-amorphization implant process.

Another illustrative method comprises selectively pre-amorphizing source/drain regions of a transistor while preventing pre-amorphization of a gate electrode of the transistor.

According to still another embodiment, a semiconductor device comprises at least one transistor with source/drain regions having a pre-amorphized portion. A gate electrode of the at least one transistor is free of pre-amorphized portions.

BRIEF DESCRIPTION OF THE DRAWINGS

The disclosure may be understood by reference to the following description taken in conjunction with the accompanying drawings, in which like reference numerals identify like elements, and in which.

Figure 1A:
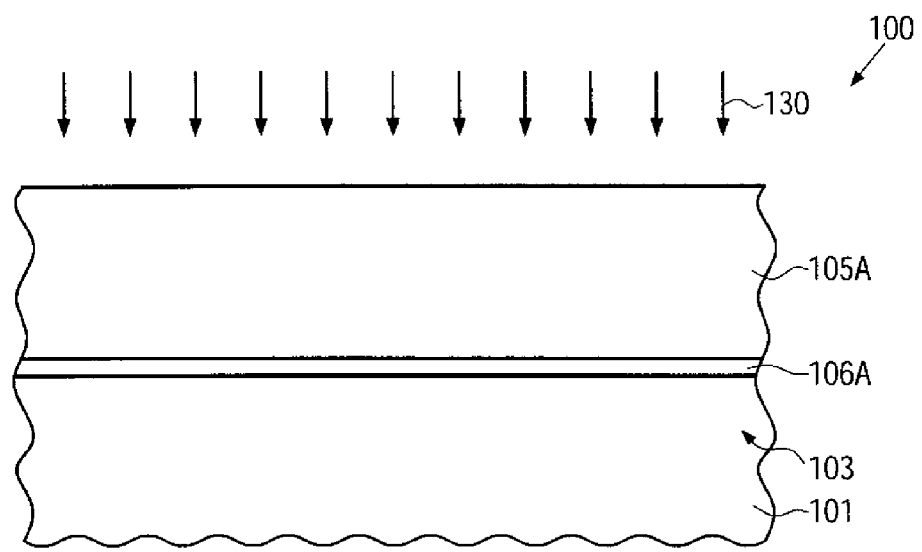
FIGS. 1A-1H schematically show cross-sectional views of a semiconductor device including transistor source/drain regions thereof that are selectively pre-amorphized while a gate electrode of the transistor is protected from pre-amorphization, and the formation of various stressors, in accordance with illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein is related to a technique that enables the formation of a transistor involving pre-amorphized source/drain regions, whereas a gate electrode of the transistor is not pre-amorphized, i.e., a crystalline structure of the gate electrode is preserved during pre-amorphization of the source/drain regions. To this end, a pre-amorphization implant blocking material, termed "blocking material" in the following, may be formed above the gate electrode. The blocking material may be structured with the gate electrode in the same processing steps. According to other illustrative embodiments, the blocking material may be structured separately or may be applied after structuring the gate electrodes. The pre-amorphization may facilitate a dopant implantation and may contribute to the formation of shallow, box-like dopant profiles in the vicinity of the gate electrode. The blocking material may be removed in any appropriate step of transistor formation. According to some illustrative embodiments, it is removed at least before the formation of a silicide in the source/drain regions and the gate electrode. The blocking material, together with another material which is to be removed, may be removed according to well-established manufacturing processes. Thus, the removal of the blocking material does not require additional steps compared to well-established manufacturing processes. For example, the blocking material may be removed in the course of the formation of sidewall spacers adjacent the gate electrode. As is well established, the sidewall spacer may be used as a mask for generating a desired dopant profile in the source/drain regions.

The principles disclosed herein are also useful in combination with the usage of a stressor to provide a respectively stressed channel region below the gate electrode. For example, the sidewall spacer may induce a stress in the channel region. The sidewall spacer may be separated from the gate electrode and the source/drain region by an intermediate liner, which itself may induce a stress in the channel region. Further, a stress-inducing layer may be formed over the transistor, e.g., in the form of a dielectric contact layer or in the form of an etch stop layer. According to further illustrative embodiments, the sidewall spacer may be removed before forming the stress-inducing layer. Another method of providing stress transfer into the channel region includes a stress memorization technique. Herein, a cover layer is formed over the source/drain regions, wherein the cover layer is of a relatively stiff material that is capable of withstanding stress developing during annealing of the pre-amorphized source/drain regions without considerable deformation such that a respective opposite stress is formed in the source/drain regions itself. This stress is preserved, i.e., memorized, even after removal of the cover layer.

The present subject matter is applicable to both NMOS and PMOS transistors, wherein it should be understood that the term NMOS is to be considered as a generic notion for any type of N-channel field effect transistor and similarly the term PMOS is to be considered as a generic notion for any type of P-channel field effect transistor. According to some illustrative embodiments, the crystalline structure of gate electrodes of NMOS transistors, as well as of PMOS transistors, are preserved during pre-amorphization of the source/drain regions. According to other embodiments, the crystalline structure of the gate electrodes of only one of the PMOS and NMOS transistors is selectively preserved during pre-amorphization of the source/drain regions, whereas the other gate electrode is pre-amorphized. For example, the gate electrodes of NMOS transistors may be selectively preserved crystalline during pre-amorphization, whereas the gate electrodes of the PMOS transistors may be amorphized.

Surprisingly, embodiments disclosed herein yield performance benefits in terms of speed up to approximately 4-8% for an NMOS transistor. Moreover, the present subject matter allows for more precise balancing of the performance of the NMOS transistors and the PMOS transistors which both contribute to the performance of the semiconductor device as a whole.

According to one illustrative embodiment, the manufacture of a transistor may involve selective pre-amorphization of source/drain regions of the transistor while maintaining a gate electrode of the transistor crystalline. In combination with well-established stressors inducing a corresponding strain in the channel region of a transistor, it has been found that the stress/strain transfer into the channel region of the respective transistor may be increased by maintaining the gate electrode of the transistor in its (poly-)crystalline state, without pre-amorphization.

FIG. 1A schematically illustrates a cross-sectional view of a semiconductor device 100 comprising a substrate 101, in and on which a transistor element is to be formed. The substrate 101 may represent any appropriate substrate having formed thereon a substantially crystalline semiconductor layer 103 that enables the formation of the transistor element. In one illustrative embodiment, the semiconductor layer 103 may represent a silicon-based semiconductor material, which may be formed on a buried insulating layer (not shown), so that the substrate 101 may represent an SOI-like substrate. In other embodiments, the semi-conductor layer 103 may be formed on top of a bulk semiconductor substrate, where the transistor element may represent bulk transistor devices. It should be understood that although only one transistor is shown throughout FIGS. 1A to 4B, according to illustrative embodiments, a plurality of transistors may be formed in and on the semiconductor layer 103. The semiconductor layer 103 may have a thickness that is adapted to the specific design rules for the transistor elements, for instance, when these transistor elements represent SOI-like transistors. It should be understood that the term SOI-transistor is to be considered as a generic term for any substrate and transistor formed thereon having at least one insulating portion, above which is formed a crystalline semiconductor layer that is appropriate for the formation of transistor elements therein. In one illustrative embodiment, the semiconductor layer 103 is designed so as to enable the formation of partially depleted transistor elements, while, in other embodiments, the thickness of the layer 103 may be appropriate for the formation of fully depleted devices or, in other cases, bulk devices may be formed in the layer 103.

A typical process flow for forming the semiconductor device 100 as shown in FIG. 1A may comprise the following processes. The substrate 101, when including a buried insulating layer, may receive the semiconductor layer 103, for instance in the form of an undoped or pre-doped crystalline silicon layer, wherein the silicon layer may be formed by wafer bond techniques or any other well-established techniques for providing SOI substrates. In other cases, the semiconductor layer 103 may be formed by epitaxial growth techniques on the basis of a substantially crystalline template provided in the substrate 101. Thereafter, any isolation structures (not shown) may be formed on the basis of well-established recipes, such as photolithography and anisotropic etch techniques followed by appropriate deposition and polishing techniques, when the formation of trench isolation structures is contemplated. Next, an appropriate dielectric layer 106A, may be formed by oxidation and/or deposition followed by the deposition of a gate electrode material layer 105A, such as polysilicon or pre-doped polysilicon, which may be accomplished by well-established low pressure chemical vapor deposition (CVD) techniques. The dielectric layer 106A serves as a gate insulating layer.

Over the gate electrode material layer 105A, a pre-amorphization implant blocking material 132 (FIG. 1B) is formed by a pre-amorphization implant blocking material deposition process 130. The deposition process 130 may be any appropriate method for depositing the pre-amorphization implant blocking material 132, e.g., chemical vapor deposition, e.g., plasma assisted chemical vapor deposition, physical vapor deposition, e.g., sputtering, etc. The pre-amorphization implant blocking material may be any material that is capable of blocking the pre-amorphization implant applied in a later manufacturing stage. For example, the pre-amorphization implant blocking material 132 may be, e.g., silicon-oxygen-nitrogen (SiON) or, e.g., silicon nitride.

Figure 1B:
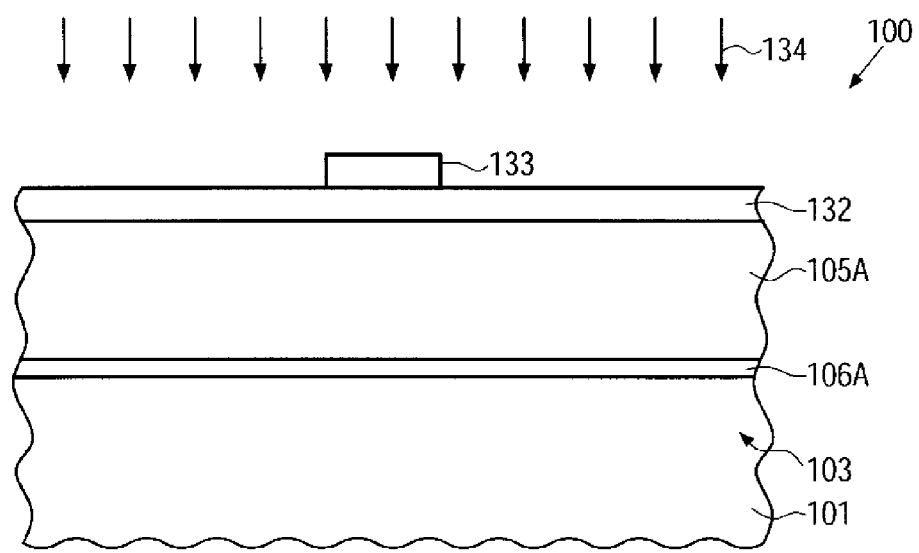

FIG. 1B shows the semiconductor device 100 in a further advanced manufacturing stage, where the formation of the pre-amorphization implant blocking material 132 over the gate electrode layer 105A has been completed. Thereafter, the pre-amorphization implant blocking material 132, the gate electrode material 105A and the dielectric layer 106A may be patterned on the basis of well-established techniques, e.g., by using a mask 133 and at least one anisotropic etch process 134. For example, highly selective etch recipes for silicon, silicon nitride and silicon dioxide are well established in the art and may be used during the etch process 134. Depending on the device strategy, a resist mask or a hard mask, or both, may be used for patterning the gate electrode material, so as to obtain the respective gate insulation layer 106 and the gate electrode 105 covered with the pre-amorphization implant blocking material 132. The mask 133 may be removed on the basis of well-established techniques. For example, a resist mask may be removed on the basis of a well-established oxygen plasma based process, followed by any appropriate cleaning processes.

Figure 1C:
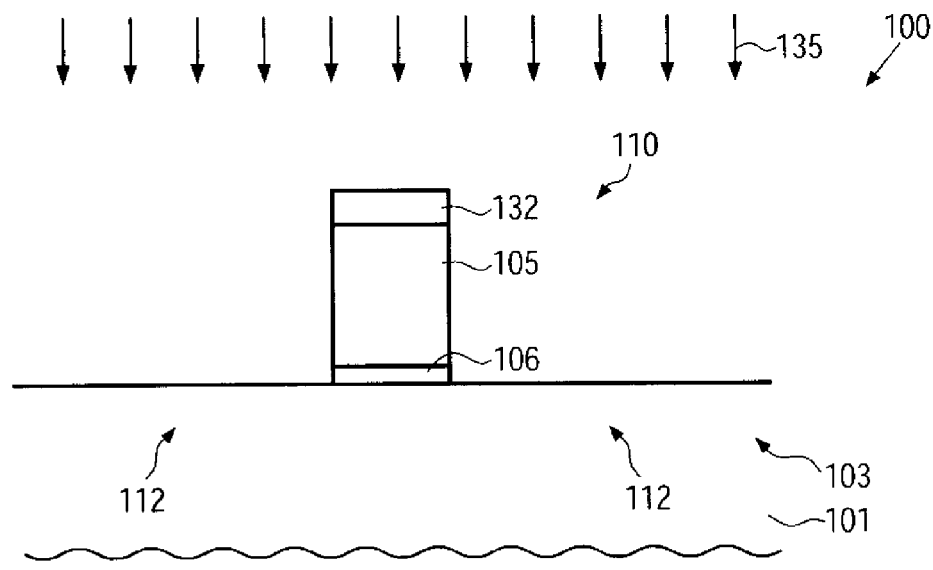

FIG. 1C shows the semiconductor device 100 in a further advanced manufacturing stage, wherein the anisotropic etch process 134 has been completed, resulting in the respective gate insulation layer 106 and the gate electrode 105 covered with the pre-amorphization implant blocking material 132. Thereafter, as illustrated in FIG. 1C, a pre-amorphization implantation process 135 is performed according to well-established techniques, e.g., implantation of a pre-amorphization implant (PAI) into the semiconductor layer 103. According to illustrative embodiments, elements used for pre-amorphization implantation may be, for example, silicon (Si), germanium (Ge), xenon (Xe), etc. According to illustrative embodiments, the pre-amorphization implant is implanted as ions, e.g., positively charged ions. As stated before, the pre-amorphization implant blocking material 132 stops the pre-amorphization implant process 135. Hence, the gate electrode 105 is maintained without any substantial pre-amorphization, e.g., in its original (poly-)crystalline structure.

According to one illustrative embodiment, the mask 133 is removed before carrying out the pre-amorphization process 135, as shown in FIG. 1C. According to other illustrative embodiments, the mask 133 may be present during the pre-amorphization process 135. In this way, the mask 133 may act as a pre-amorphization implant blocking material. According to other illustrative embodiments, the mask 133 may be configured, e.g., in size, material, etc., to act as pre-amorphization implant blocking material, blocking the pre-amorphization of the gate electrode 105. In this illustrative embodiment, the mask 133 may serve as pre-amorphization implant blocking material and the additional pre-amorphization implant blocking material 132 may be omitted.

According to further illustrative embodiments, the source/drain regions 112 of the transistor 110 are of different composition than the channel region 113. For example, the channel region 113 may be based on silicon, whereas the source/drain regions comprise silicon and a further component that has a covalent radius different from silicon, resulting in a lattice constant of the source/drain regions that differs from the lattice constant of silicon, thereby inducing a respective strain in the channel region. For example, if the source/drain regions comprise an element having a covalent radius greater than silicon, e.g., germanium (Ge) or tin (Sn), in a certain amount, a compressive stress is induced in the channel region 113. Likewise, if the source/drain regions comprise an element having a covalent radius smaller than silicon, e.g., carbon (C), in a certain amount, the source/drain regions 112 induce a tensile strain in the channel region 113. The respective amounts for the respective further component may be taken according to well-established compositions. For example, germanium may be present in an amount ranging from 1-30%, whereas carbon may be present in an amount ranging from 0.1-10%.

According to one illustrative embodiment, the further component may be deposited in the source/drain regions before carrying out the pre-amorphization process 135. For example, recesses (not shown) may be formed in the semiconductor layer 103 according to well-established techniques and recipes. Thereafter, the recesses may be filled with the desired semiconductor composition. It should be understood that this process involves several well-established etching and masking steps. According to another illustrative embodiment, the further component may deposited by ion implantation. The formation of the source/drain regions having the further component may take place before or after the formation of the gate electrode. According to a still further embodiment, the pre-amorphization implant may be based on the further component. In other words, the pre-amorphization of the regions 136 is performed by implanting the further component, employing respective implantation parameters.

Figure 1D:
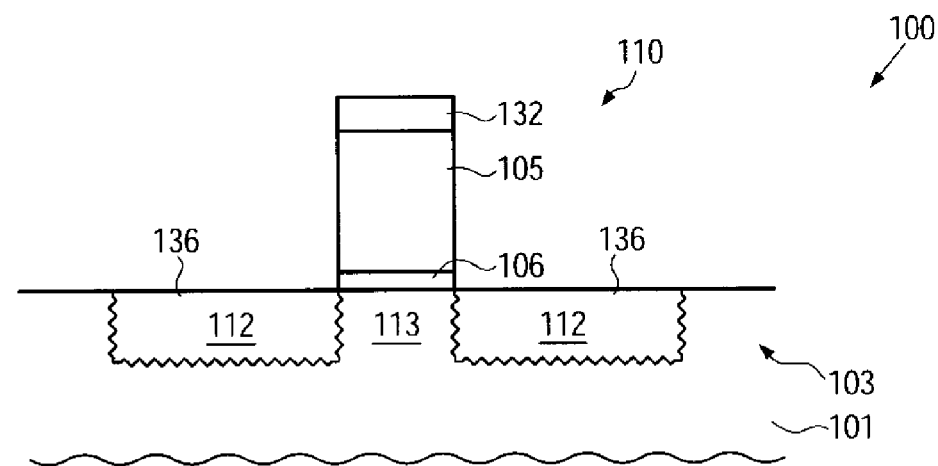

FIG. 1D shows the semiconductor device 100 in a further advanced manufacturing stage wherein the pre-amorphization process 135 has been completed and pre-amorphized regions 136 have been formed in the semiconductor layer 103. According to some illustrative embodiments, the pre-amorphized regions 136 are formed such that at least part of the semiconductor layer 103 where the source/drain regions (not shown in FIG. 1D) of the transistor 110 will be formed are pre-amorphized. For example, the pre-morphized regions 136 may be formed to be smaller than the source/drain regions and be located completely within the source/drain regions. Further, the pre-amorphized regions 136 may be formed to be larger than the source/drain regions wherein the source/drain regions are located completely within the pre-amorphized regions 136. Further, the pre-amorphized regions 136 are formed so as to partially overlay with the source/drain regions of the transistor 110. Further, the pre-amorphized regions 136 may be formed so as to define the source/drain regions of the transistor 110.

Figure 1E:
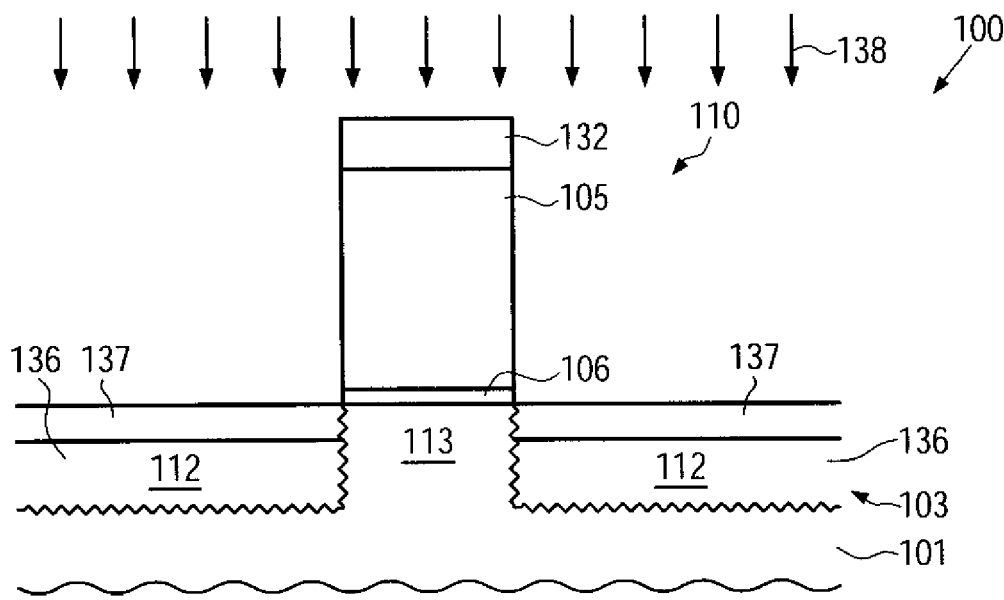

FIG. 1E shows the semiconductor device 100 in a further advanced manufacturing stage wherein a doping process has been completed and a shallow doped region 137 has been formed. The shallow doped region 137 may be box-shaped or may be of any other desired shape. According to some illustrative embodiments, the doping process includes a dopant implantation into the pre-amorphized regions 136. Herein, the gate insulating layer 106, the gate electrode 105 and the overlaying pre-amorphization implant blocking material 132 act as a mask for dopant implantation processes.

It should be understood that any implantation sequence may be performed for obtaining a required lateral dopant profile as required for the complex concentration in the drain and the source regions 112. It should be appreciated that a plurality of implantation sequences may have already taken place to provide a desired vertical dopant profile within the semiconductor layer 103 prior to the formation of the gate electrodes 105.

Figure 1F:
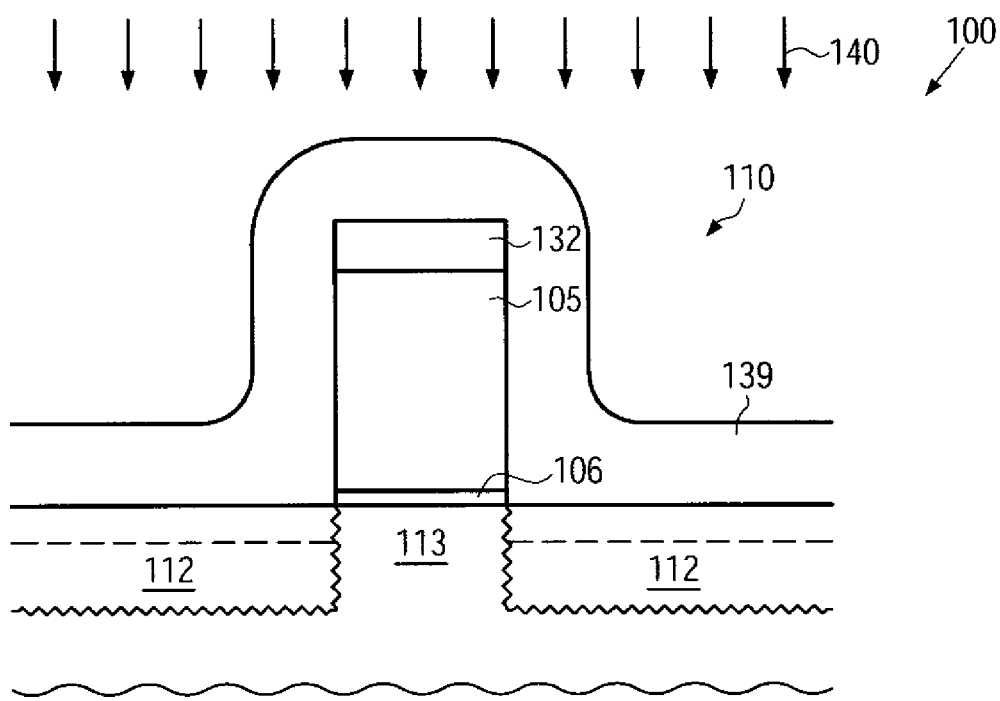
Figure 1G:
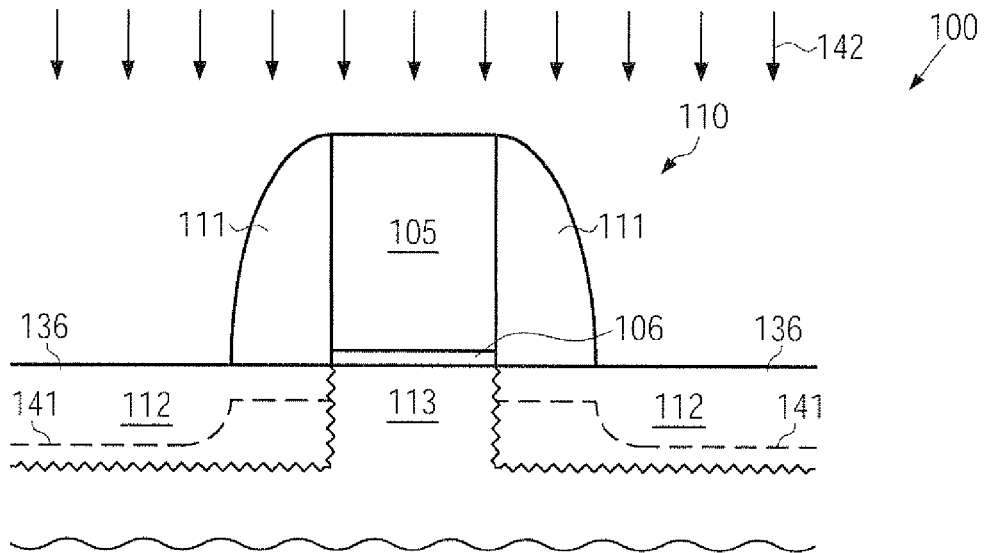

FIGS. 1E-1G further illustrate a process sequence for forming a sidewall spacer according to illustrative embodiments disclosed herein. In a first step, illustrated in FIG. 1E, a sidewall spacer material deposition process 138 is performed to thereby deposit a sidewall spacer material layer 137 (FIG. 1F) over the gate electrode 105 and the overlaying pre-amorphization implant blocking material 132. The sidewall spacer material deposition process 138 may be, for example, a plasma assisted CVD process or any other appropriate deposition process. The sidewall spacer material may be any appropriate dielectric material, including oxides and nitrides, e.g., silicon oxides and silicon nitrides. For example, the sidewall spacer material may be silicon nitride.

FIG. 1F shows the semiconductor device 100 in a further advanced manufacturing stage, wherein the formation of the sidewall spacer material layer 139 has been completed. Next, an anisotropic etch process 140 is performed to anisotropically etch the sidewall spacer material layer 139 in order to provide the sidewalls spacers. According to one illustrative embodiment, the pre-amorphization implant blocking material 132 is also removed with the anisotropic etch process 140 that is used to establish the sidewall spacers. According to other illustrative embodiments, the pre-amorphization implant blocking material 132 is removed in a separate process step.

FIG. 1G shows the semiconductor device 100 in a further advanced manufacturing stage, wherein the formation of the sidewall spacers 111 has been completed. According to illustrative embodiments of the present invention, the sidewall spacers 111 may be used for establishing a desired dopant profile 141 in the source/drain regions 112 according to well-established techniques. For example, according to further illustrative embodiments, a dopant is implanted into the source/drain regions 112 by a respective ion implant doping process 142, using the sidewall spacer 111 as a mask for generating a desired dopant profile 141 in the source/drain regions 112.

It should be appreciated that the spacers 111 may be formed in accordance with requirements of the corresponding dopant profile 141 in the regions 112 so that a width of the respective spacers 111, as well as the number thereof, may be varied in accordance with requirements. For example, a single spacer element 111 may be sufficient or more than two spacer elements may be provided to act as an implantation mask for the formation of the drain and source regions 112. After each or some of the implantation cycles or after the very last implantation process, a corresponding anneal process may be carried out to substantially activate the implanted dopants and to substantially re-crystallize the pre-amorphized regions 136 and, if present, further implantation-induced damage in the semiconductor layer 103.

According to illustrative embodiments, the sidewall spacer 111 may be configured for inducing an intrinsic stress in a channel region 113 below the gate electrode 105. It should be understood that the type of stress, i.e., compressive stress or tensile stress, is selected depending on transistor type, i.e., depending on whether the transistor 110 is a PMOS transistor or an NMOS transistor. In still a further illustrative embodiment, the one or more spacers 111 may be formed to exhibit a specific type of inherent stress, such as compressive stress or tensile stress, in order to enhance the strain generation in a respective channel region 113. For example, the sidewall spacer material layer may be deposited on the basis of well-established recipes, such as plasma enhanced chemical vapor deposition (PECVD), wherein the deposition parameters during the formation of the corresponding spacer layer may be adjusted such that a desired inherent stress is created in the layer as deposited. For example, during the deposition, e.g., the deposition of silicon nitride, the deposition parameters, such as temperature, pressure, ion bombardment and the like, may be adjusted to obtain an intrinsic stress in the respective layer ranging from a compressive stress of approximately 1.5 GigaPascal or even more to a tensile stress of approximately the same magnitude.

Figure 1H:
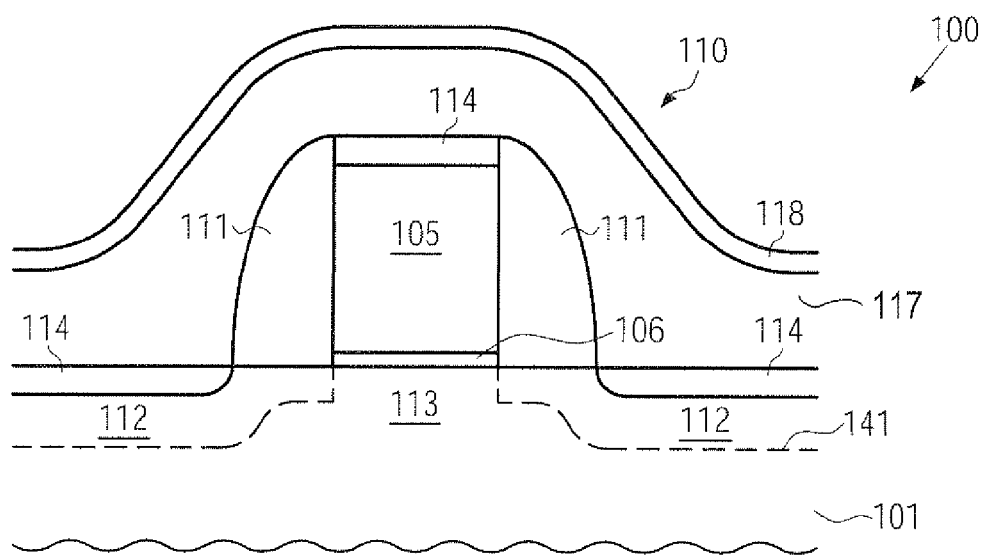

FIG. 1H shows the semiconductor device 100 in a further advanced manufacturing stage, wherein the pre-amorphized regions 136 have been annealed and the dopants illustrated by the dopant profile 141 have been activated. According to some illustrative embodiments, the annealing of the pre-amorphized regions is performed according to well-established techniques. For example, annealing the pre-amorphized regions may include heating the whole semiconductor device 100. According to other illustrative embodiments, annealing the pre-amorphized regions may include selectively heating the pre-amorphized regions 136, e.g., by laser irradiation.

Further, in the manufacturing stage shown in FIG. 1H, metal silicide regions 114 have been formed in contact portions of the source/drain regions 112 and the gate electrode 105 according to well-established techniques. For example, the respective metal silicide regions 114 may be substantially comprised of nickel silicide or nickel/platinum silicide, which may be reliably formed within a silicon/germanium material. Further, metal silicide regions 114 on the basis of nickel or nickel/platinum may be formed on the basis of appropriate temperatures, which may not exceed approximately 400° C. The metal silicide regions may be formed by depositing the respective metal on the contact portions and subjecting the semiconductor device, or at least the contact portions, to a sufficient temperature where the silicide 114 forms.

In one illustrative embodiment, the metal silicide regions 114 may comprise nickel or nickel/platinum, which may be advantageously used in combination with transistor elements containing a significant amount of non-silicon material in the drain and source regions 112, such as silicon/germanium. In other embodiments, the metal silicide regions 114 may comprise any other appropriate refractory metal, such as titanium, cobalt, tungsten, platinum and the like. Moreover, it should be appreciated that the metal silicide regions 114, although indicated by the same reference numeral, may, in some embodiments, be comprised of different materials, depending on the process and device requirements.

In accordance with still other illustrative embodiments shown in FIG. 1H, a stress-inducing layer may be formed over the transistor, wherein the stress-inducing layer induces a stress in the channel region 113 below the gate electrode 105. According to one illustrative embodiment, the stress-inducing layer is a dielectric contact layer 117. According to other illustrative embodiments, the stress-inducing layer is an etch stop layer 118.

According to some illustrative embodiments, the contact layer 117 comprises a first type of intrinsic stress to induce a corresponding strain in the respective channel regions 113. For example, the contact layer 117 may be comprised of silicon nitride having an intrinsic compressive stress, when the first transistor 100 is to represent a P-channel transistor. Consequently, in this case, the spacer element 111 may also have been formed to exhibit an intrinsic compressive stress so as to support the stress transfer mechanism provided by the contact layer 117. In the illustrative embodiment shown, the contact layer 117 is formed in close proximity to the transistor 110, wherein, in one embodiment, the first contact layer 117 is formed directly on the respective metal silicide regions 114 formed on the source/drain regions 112. According to some illustrative embodiments, the contact layer 117, which may be comprised, in one illustrative embodiment, of silicon nitride, has a desired magnitude and type of intrinsic stress, such as a tensile stress of a specified magnitude, when the transistor 110 is to represent an N-channel transistor. Consequently, in this case, the spacer element 111 may also have been formed to exhibit an intrinsic tensile stress so as to support the stress transfer mechanism provided by the contact layer 117.

Moreover, an etch stop layer or etch indicator layer 118 may be formed on or above the first contact layer 117, wherein the layer 118 may be formed of an appropriate material that enables a reliable control of a subsequent etch process for removing a second contact layer (not shown) over the transistor 110. For example, the etch stop or etch indicator layer 118 may be provided in the form of a silicon dioxide layer.

A PECVD process may be performed for depositing the first contact layer 117, for instance, as a silicon nitride layer, wherein, as previously explained, the deposition parameters may be adjusted in such a way that a desired type and magnitude of an intrinsic stress is provided in the first contact layer 117. Corresponding deposition conditions are well established in the art. For example, the first contact layer 117 may be deposited to have a specific magnitude of compressive stress, when the transistor 110 is to represent a P-channel transistor, or to have a specific magnitude of tensile stress, when the transistor 110 is to represent a N-channel transistor. Thereafter, the etch stop or etch indicator layer 118 may be deposited on the basis of well-established PECVD techniques.

Above the contact layer 117, an interlayer dielectric material may be formed to complete an interlayer dielectric material layer (not shown), in which corresponding contacts are to be formed to respective contact regions of the transistor 110, such as the gate electrode 105 and the drain or source regions 112.

According to other illustrative embodiments, the sidewall spacer 111, or at least one sidewall spacer if more than one sidewall spacer is present, may be removed from the gate electrode 105 before forming the stress-inducing layer.

Figure 2:
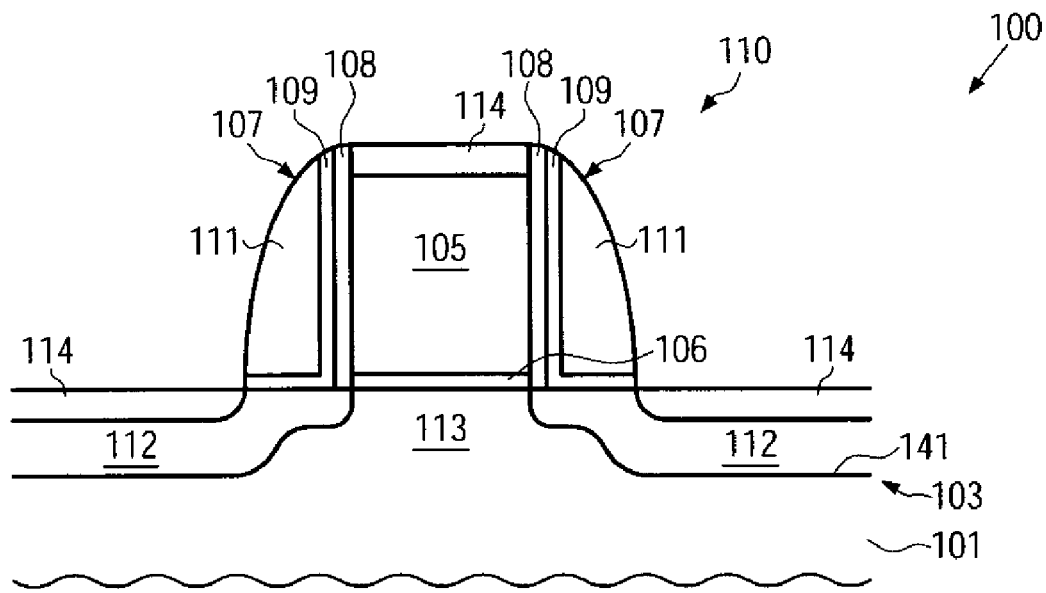
FIGS. 2 and 3 schematically show cross-sectional views of semiconductor devices having transistors in accordance with illustrative embodiments disclosed herein.

FIG. 2 shows an alternative embodiment of a spacer structure 107 which may be formed instead of the single sidewall spacer 111 of the semiconductor device 100 shown in FIG. 1H. According to other illustrative embodiments, the spacer structures 107 may comprise, in the depicted stage of manufacturing, an offset spacer 108 which may be comprised of any appropriate material, such as silicon dioxide. The offset spacer 108, if required, may be formed by depositing and/or oxidizing the device 100 and anisotropically removing horizontal portions of the layer to form the spacers 108. Further, a conformal liner or spacer 109 may be formed, which may exhibit a substantially L-shaped configuration, that is, the spacer 109 comprises a portion of a specified thickness that extends along the sidewall of the gate electrode 105 and also comprises a portion having substantially the same thickness that extends along a part of the semiconductor layer 103, in which respective drain and source regions 112 are formed. Consequently, the spacer 109 may be considered as a conformally formed liner or spacer, the shape of which substantially corresponds to the shape of the gate electrode 105, with a "horizontal" portion extending along a part of the drain and source regions 112, thereby separating one or more additional spacers 111 from the gate electrode 105 and the drain and source regions 112.

The spacer 111 may be formed of a dielectric material that may exhibit a significant etch selectivity with respect to the dielectric material of the spacer 109 in view of a specific etch recipe so as to enable a selective removal of the spacer 111 while substantially maintaining the spacer 109. For example, in one illustrative embodiment, the conformal or L-shaped spacer 109 may be comprised of silicon dioxide, while the one or more spacers 111 may be comprised of silicon nitride. However, other regimes for the spacers 109 and 111 may be contemplated. For instance, in another illustrative embodiment, the L-shaped spacer 109 may be comprised of silicon nitride, while the spacer 111 may be formed of silicon dioxide.

The conformal spacer 109 may be formed by initially depositing an appropriate dielectric material, such as silicon dioxide, with the specified thickness in a highly conformal fashion, and subsequently a further spacer layer, for instance a silicon nitride layer, may be deposited on the basis of well-established recipes, such as PECVD, wherein, as previously noted, the deposition parameters during the formation of the corresponding spacer layer may be adjusted such that a desired inherent stress is created in the layer 109 as deposited.

Prior to the removal or deposition of respective portions of the spacer structure 107, a further implantation process may be performed in order to obtain the required lateral dopant profile in the drain and source regions 112.

Figure 3:
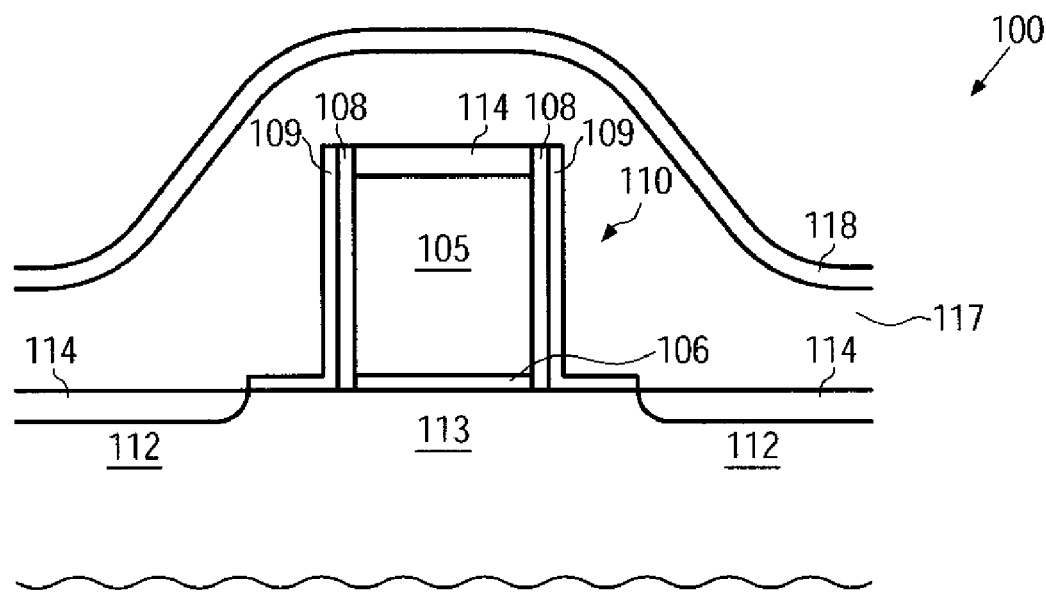

FIG. 3 shows an alternative embodiment of a semiconductor device having a stress-inducing layer 117, 118 formed over the transistor 110. The spacer structure 107 of the transistor 110 shown in FIG. 3 has been formed in accordance with the spacer structure described with respect to FIG. 1H, except that the sidewall spacer 111 has been removed prior to the formation of the stress-inducing layer 117, 118. The transistor shown in FIG. 3 may be, for example, an NMOS transistor. Hence, the various stressors employed may be configured to induce a tensile strain in the channel region 113.

Figure 4A:
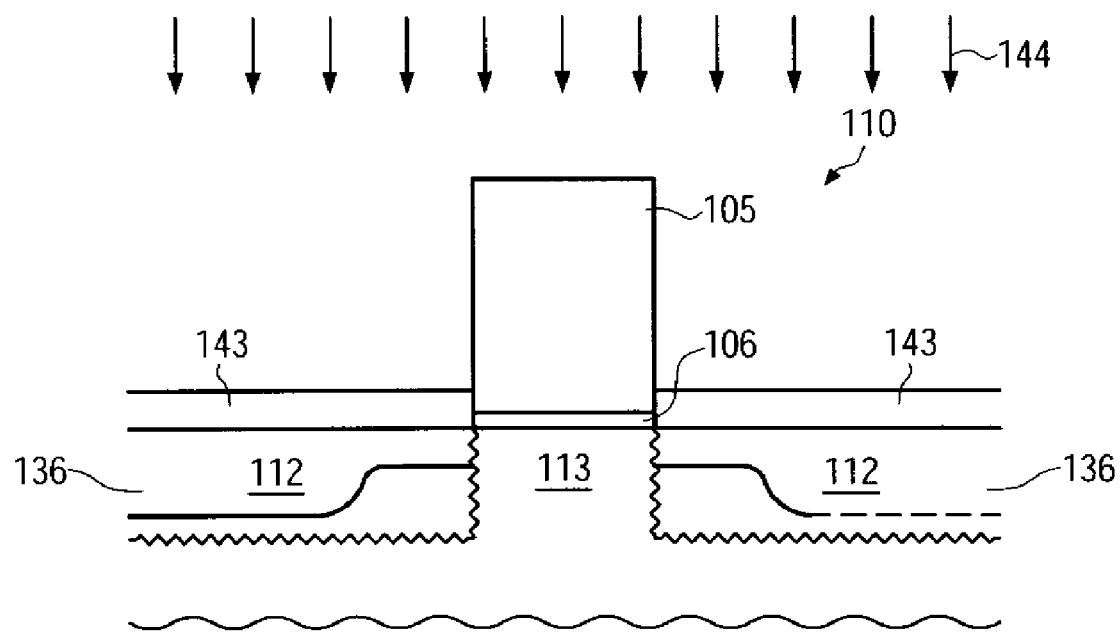
FIGS. 4A-4B schematically shows cross-sectional views of a semiconductor device illustrating the formation of intrinsic stresses in source/drain regions by a stress memorization technique in accordance with illustrative embodiments disclosed herein.
Figure 4B:
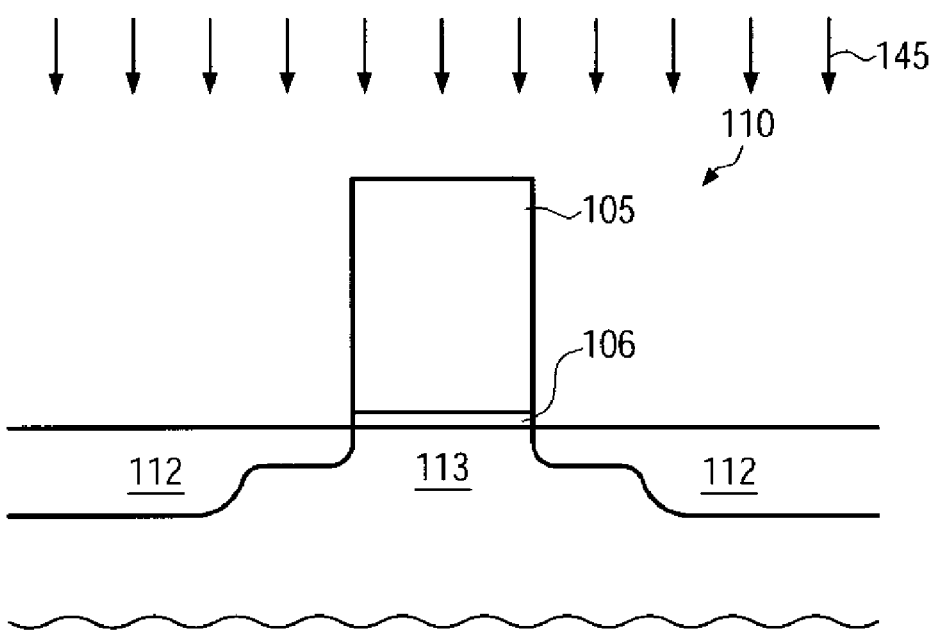

FIGS. 4A and 4B illustrate a further embodiment of establishing a desired strain in the channel region 113 by a so-called stress memorization technique. FIG. 4A shows the transistor 110 in a manufacturing stage that is comparable to the manufacturing stage shown in FIG. 1G except that the sidewall spacers 111 have been removed. In accordance with one illustrative embodiment, a cover layer 143 is formed over the source/drain regions 112 by a cover layer deposition process 144, e.g., a PECVD process. The cover layer 143 may be selectively deposited, e.g., by employing an appropriate masking and etching regime. According to other illustrative embodiments, the cover layer 143 may be provided over the whole transistor 110. After deposition of the cover layer 143, the pre-amorphized regions 136 are annealed. Usually this annealing is accompanied by a volume reduction of the pre-amorphized region 136. Since the cover layer prevents, or at least reduces, a shrinkage of the pre-amorphized regions 136 during annealing, a tensile stress develops in the annealed regions 136 inducing a tensile strain in the channel region 113. It should be understood that the cover layer 143 has to be formed so as to have an appropriate stress resistance, i.e., to withstand the stresses involved with the annealing of the pre-amorphized regions 136. According to one illustrative embodiment, the cover layer 143 is formed of silicon nitride.

FIG. 4B shows the semiconductor device 100 in a further advanced manufacturing stage, after the annealing of the pre-amorphized regions 136. It has been found that the stress is substantially preserved, i.e., "memorized," even after removal of the cover layer 143. The removal 145 of the cover layer may be carried out depending on the material of the cover layer according to well-established etch techniques for the respective cover layer material.

While the above-mentioned illustrative embodiments have been described with reference to a single transistor, it should be understood that a semiconductor device usually comprises a plurality of transistors. The plurality of transistors may be of the same transistor type, e.g., of the N-channel transistor type or of the P-channel transistor type. According to other illustrative embodiments, the plurality of transistors include P-channel transistors as well as N-channel transistors.

Figure 5:
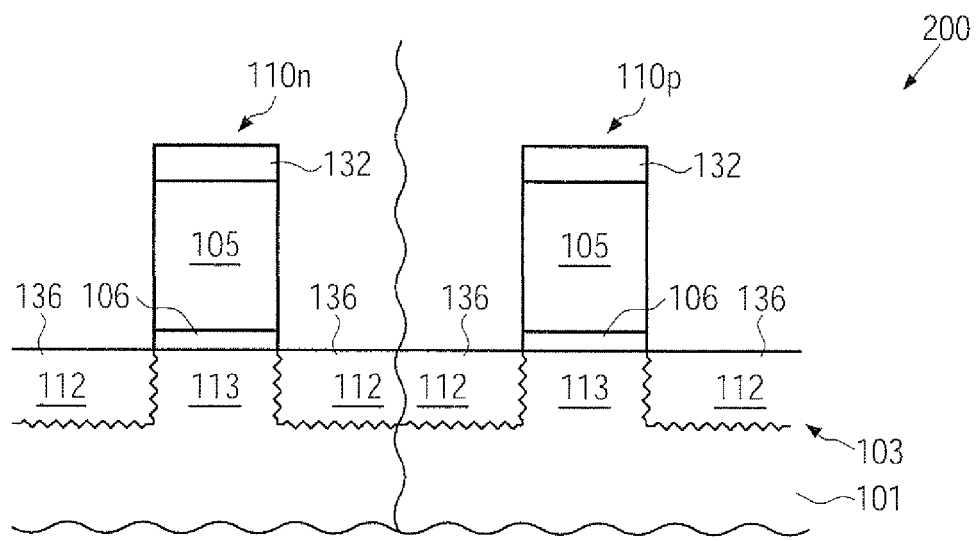
FIG. 5 schematically shows a cross-sectional view of a semiconductor device including two different types of transistors.

FIG. 5 shows a semiconductor device 200 in accordance with illustrative embodiments of the present subject matter. The semiconductor device 200 comprises N-channel transistors as well as P-channel transistors. According to one illustrative embodiment, the substrate 101 comprises gate electrodes 105 of an N-channel transistor 110n and a P-channel transistor 110p, with the pre-amorphization implant blocking material 132 over the gate electrodes 105 of the N-type transistor 110n and the P-type transistor 110p, as illustrated in FIG. 5. The transistors 110n, 110p are depicted in a manufacturing stage that corresponds to the manufacturing stage of the transistor 110 shown in FIG. 1E, the details of which and the manufacture of which are not repeated here. It should be understood that the transistors 110n, 110p may be formed in accordance with at least one of the above-mentioned illustrative embodiments discussed with reference to FIGS. 1A-4B.

In accordance with other illustrative embodiments, the pre-amorphization implant blocking material 132 is not formed over the gate electrodes 105 of all the transistors 110 of a semiconductor device, but rather over only part of the transistors of a semiconductor device. In other words, the pre-amorphization implant blocking material 132 is selectively formed over part of the gate electrodes of a semiconductor device. According to one illustrative embodiment, the pre-amorphization implant blocking material 132 is formed over the gate electrodes of NMOS transistors, whereas the gate electrodes of PMOS transistors are free of the pre-amorphization implant blocking material 132.

Figure 6A:
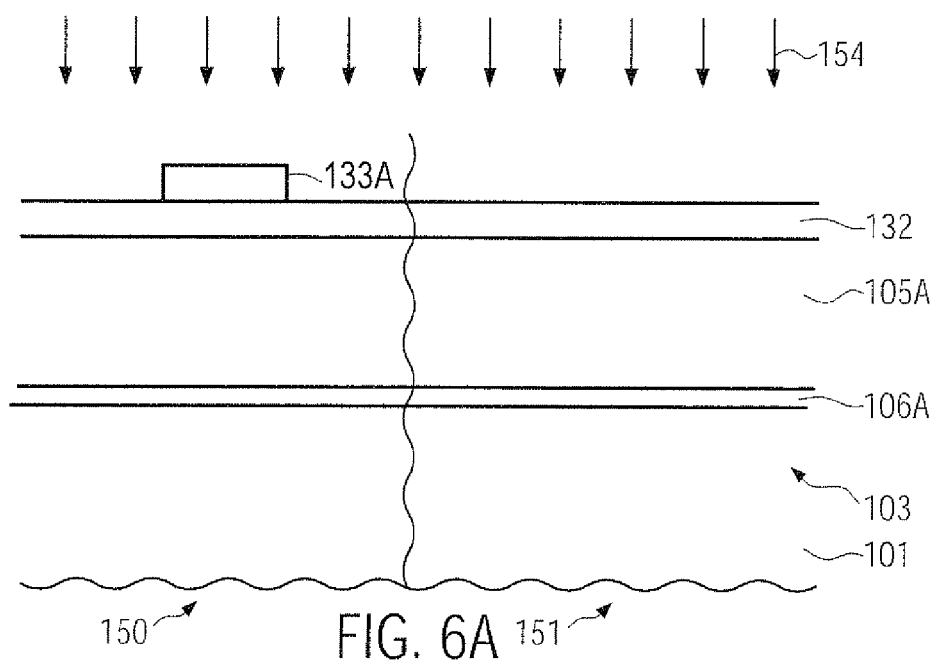
FIGS. 6A-6C schematically show cross-sectional views of a semiconductor device including two different types of transistors, such as P-channel transistors and N-channel transistors, source/drain regions thereof that are selectively pre-amorphized while a gate electrode of the transistor is protected from pre-amorphization in accordance with illustrative embodiments disclosed herein.
Figure 6B:
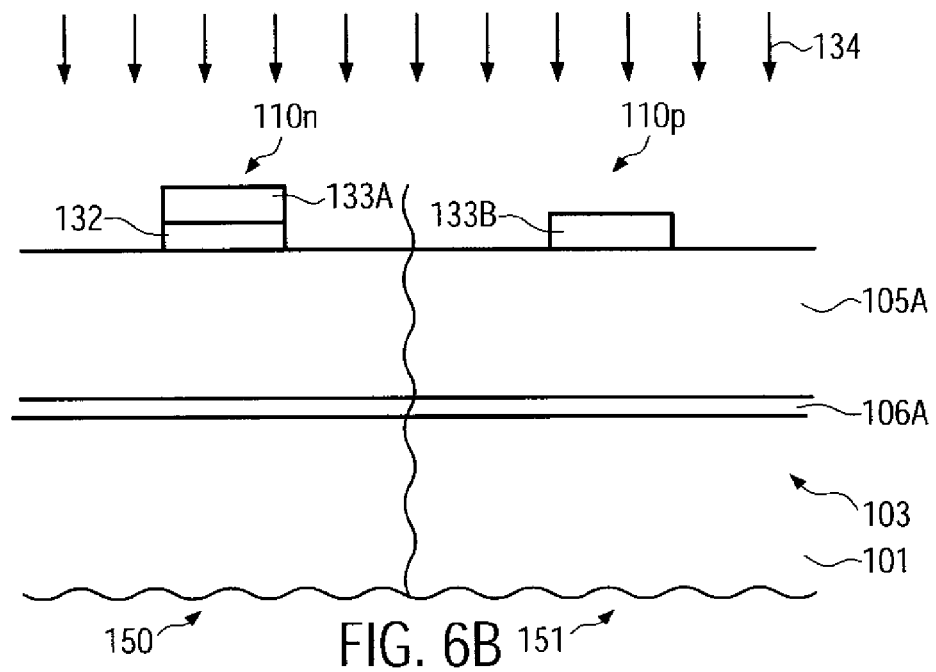
Figure 6C:
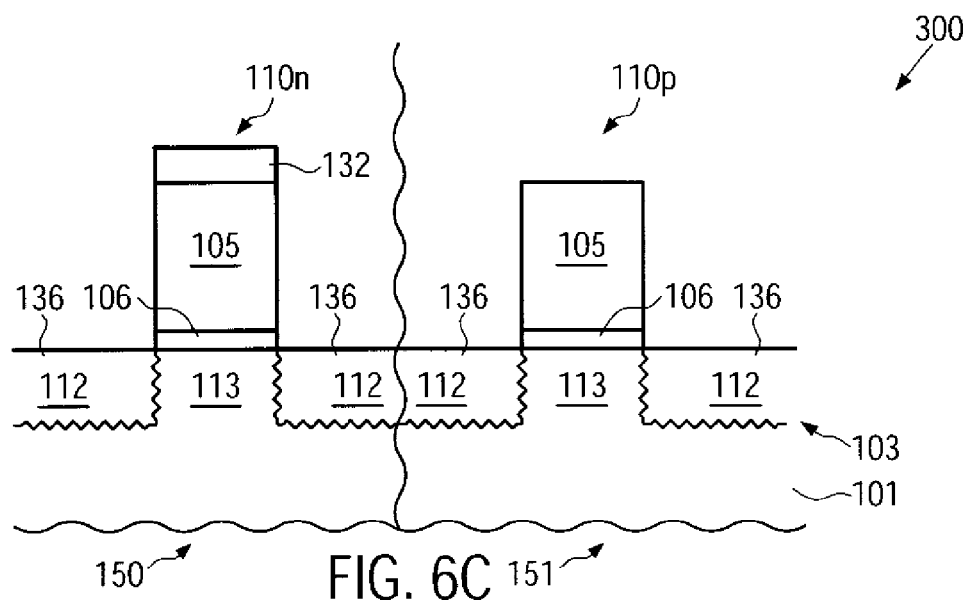

FIGS. 6A-6C illustrate a process sequence for the manufacture of a semiconductor device 300 wherein the pre-amorphization implant blocking material 132 is selectively formed over part of the gate electrodes of the semiconductor device 300.

FIG. 6A shows a semiconductor device 300 comprises a substrate 100 having a semiconductor layer 103. The semiconductor device 300 comprises a dielectric layer 106A above the semiconductor layer 103. Above the semiconductor layer 106A, a gate electrode material layer 105 is formed. The gate electrode material layer 105 is covered with the pre-amorphization implant blocking material 132. The above-described materials and layers of the semiconductor device 300 correspond to the respective materials and layers described with regard to the semiconductor device shown in FIGS. 1A and 1B, and the description of which is not repeated here.

The semiconductor device 300 comprises a first region 150 wherein a first transistor 110n is to be formed and a second region 151 wherein a second transistor 110p is to be formed. In the first region 150, the pre-amorphization implant blocking material 132 is partially covered with a mask 133A, e.g., a photoresist or a hard mask, to define the lateral dimensions of a gate electrode of the first transistor. In the second region 151, the pre-amorphization implant blocking layer 132 is uncovered. The mask 133A may be formed according to well-established techniques, wherein the material of the mask is selected to have a good etch selectivity with regard to the pre-amorphization implant blocking material 132.

In the second region 151, the exposed pre-amorphization implant blocking material 132 is selectively removed by an etch process 154, whereas the pre-amorphization implant blocking material 132 of the first region 150 is only partially removed by the etch process 154, maintaining the portion of the pre-amorphization implant blocking material 132 under the mask 133A. The removal of the pre-amorphization implant blocking material 132 exposes the gate electrode material layer 105A. Next, a gate defining mask 133B, e.g., of the same type as the mask 133A of the first region 150, is formed over the gate electrode material layer 105A of the second region 151.

FIG. 6B shows the semiconductor device 300 in a further advanced manufacturing stage, wherein the exposed portions of the pre-amorphization implant blocking material 132 have been removed from the gate electrode material layer 105A and the formation of the gate defining mask 133B in the second region 151 has been completed. Hence, the manufacturing stage of the semiconductor device 300 in FIG. 6B is characterized by two masking layers 133A, 133B which define the gate electrode in the first region 150 and the second region 151, respectively. Further, between the first masking layer 133A and the gate electrode material layer 105A is located the pre-amorphization implant blocking material 132, whereas no pre-amorphization implant blocking material 132 is located between the second masking layer 133B and the gate electrode material layer 105A. In the manufacturing stage shown in FIG. 6B, the second masking layer 133B in the second region 151 is directly located on the gate electrode material layer 105A.

Subsequently, the gate electrodes 105 defined by the first masking layer 133A and the second masking layer 133B may be provided by performing an anisotropic etch process 134 which removes the exposed portions of the gate electrode material layer 105A. The anisotropic etch process 134 may be performed in accordance with the details disclosed with regard to FIG. 1B. Thereafter, the masking layer 133A and the masking layer 133B are removed on the basis of well-established techniques as disclosed with regard to FIG. 1B. According to one illustrative embodiment, the masking layer 133A and the masking layer 133B are removable with the same technique in a single step. For example, an identical material may be used for forming the first masking layer 133A and the second masking layer 133B. This results in a semiconductor device 300 comprising a first transistor in a respective manufacturing stage, the first transistor having a gate electrode covered by a pre-amorphization implant blocking material 132, and a second transistor in a respective manufacturing stage, the second transistor 110p having a gate electrode free of the pre-amorphization implant blocking material 132.

FIG. 6C shows the semiconductor device 300 in a further advanced manufacturing stage, wherein the pre-amorphization process has been carried out, yielding pre-amorphized regions 136 of each of the first transistor 110n and the second transistor 110p. As a result, the first transistor 110n of the semiconductor device 300 comprises source/drain regions 112 which are at least in part pre-amorphized and a gate electrode 105 free or substantially free of pre-amorphized regions, and the second transistor 110p of the semiconductor device 300 comprises source/drain regions 112 which are at least in part pre-amorphized and a gate electrode 105 which is at least in part pre-amorphized.

Regarding further processing of the semiconductor device 300, the first transistor 110n may generally be processed as the transistor 110 described above with regard to FIGS. 1A-4B. The second transistor 110p may generally be processed as the transistor 110 described above with regard to FIGS. 1A-4B, except that no pre-amorphization implant blocking material 132 has to be removed. However, it is to be understood that process sequences which are carried out on only one of the two transistors 110n, 110p require masking of the other of the two transistors 110n, 110p, e.g., by a photoresist mask or a hard mask. Further, silicidation may be preformed by respective techniques which require less elevated temperature techniques if necessary.

For example, metal silicide regions which are formed first may be formed of cobalt silicide, which may be formed at an elevated temperature, whereas metal silicide regions formed at a later manufacturing stage may be provided in the form of nickel silicide or nickel/platinum silicide requiring less elevated temperatures. Metal silicides may be further used to prevent adverse effects of high temperatures to the various stressors of the semiconductor device.

In accordance with well-established techniques, difference in metal silicides for NMOS and CMOS transistors may also be used for balancing any asymmetry in the device behavior of the first and second transistor devices 110p, 110n due to the difference in conductivity of, for instance, nickel silicide with respect to cobalt silicide. Moreover, a provision of two types of metal silicide may be considered appropriate, when significant amounts of other semiconductor materials, such as germanium, carbon and the like, may be present in the gate electrode 105 and/or the drain and source regions 112.

According to one illustrative embodiment, the first transistor 110n of the semiconductor device 300 is an NMOS transistor and the second transistor 110p of the semiconductor device 300 is a PMOS transistor.

It should further be appreciated that the first transistor 110p and the second transistor 110n may be formed in close proximity to each other, wherein a corresponding isolation structure (not shown) may be provided, as is typically provided in sophisticated applications, in the form of a shallow trench isolation. In other embodiments, the transistors 110p and 110n may represent transistors provided in different die regions formed on the substrate 101.

In summary, a technique is presented which provides for a pre-amorphization of source/drain regions of a transistor while preventing pre-amorphization of a gate electrode of the transistor. According to illustrative embodiments, the pre-amorphization provides benefits in regard to the formation of a desired dopant profile of a source/drain region. According to illustrative embodiments, the stress transfer mechanism of transferring a stress into the channel region to thereby induce a corresponding strain in the channel region may be improved by preventing pre-amorphization of the gate electrode. According to illustrative embodiments, a pre-amorphization implant blocking material is formed over gate electrodes which are to be prevented from being pre-amorphized. The pre-amorphization implant blocking material may be patterned together with the gate electrode. According to other illustrative embodiments, the pre-amorphization blocking implant may be patterned in a separate step, involving well-established techniques and recipes for the respective blocking material. According to illustrative embodiments, the blocking material may be silicon oxygen nitrogen (SiON) or silicon nitride. Application of the inventive technique has been illustrated for single transistors as well as for a plurality of transistors, for a single type of transistors as well as for different types of transistors.

Various stressors for inducing a stress in the channel region of a transistor have been discussed and are well established in the art. According to illustrative embodiments, the type of stress provided by the stressors is adapted to the transistor type to which it is applied. According to one illustrative embodiment, the one or more spacers may be formed so as to exhibit a specific type of inherent stress, such as compressive stress or tensile stress, in order to enhance the strain generation in a respective channel region, thereby significantly enhancing the stress transfer mechanism, at least for one type of transistor, wherein the respective spacer elements for the other type of transistor may be removed. Other stress transfer mechanisms applicable in conjunction with the subject matter disclosed herein include the formation of a stress-inducing semiconductor alloy in source/drain regions of the transistor. Depending on the composition and the elements used, compressive stresses, as well as tensile stresses, may be induced in the channel region. According to illustrative embodiments, a stress-inducing layer may be formed over the respective transistors, wherein the stress-inducing layer may be, for example, a dielectric contact layer or an etch stop layer. Other illustrative embodiments employ a stress memorization technique wherein an intrinsic stress is developed and memorized in source/drain regions by annealing the pre-amorphized regions under a cover layer that is capable of resisting at least part of the stresses developing during annealing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

providing a substrate;

said substrate having a gate electrode of a transistor with a pre-amorphization implant blocking material over said gate electrode;

said substrate having source/drain regions of said transistor that are free of said pre-amorphization implant blocking material;

subjecting said substrate to a pre-amorphization implant process to thereby pre-amorphize at least part of said source/drain regions while blocking said gate electrode from said pre-amorphization implant process forming a cover layer over said source/drain regions;

performing an annealing process on said pre-amorphized regions, wherein said cover layer is adapted to reduce a volume change of said pre-amorphized regions due to said annealing process; and removing said cover layer from said source/drain regions.

2. The method of claim 1, wherein providing said substrate comprises:

providing said substrate having a gate insulating layer;

forming said gate electrode material layer over said gate insulating layer;

forming said pre-amorphization implant blocking material over said gate electrode material layer; and patterning said pre-amorphization implant blocking material and said gate electrode material layer so as to provide said gate electrode with said pre-amorphization implant blocking material over said gate electrode.

3. The method of claim 2, wherein patterning said pre-amorphization implant blocking material comprises:

forming a mask over said pre-amorphization implant blocking material, said mask being positioned above said gate electrode; and removing said pre-amorphization implant blocking material and said gate electrode material layer in regions not covered by said mask so as to provide said gate electrode with said pre-amorphization implant blocking material over said gate electrode and said mask over said pre-amorphization implant blocking material.

4. The method of claim 1, further comprising:

implanting a dopant in said at least partially pre-amorphized source/drain regions; and annealing said source/drain regions.

5. The method of claim 4, further comprising:

removing said pre-amorphization implant blocking material; and forming a metal silicide over each of said source/drain regions and said gate electrode.

6. The method of claim 1, further comprising forming a sidewall spacer at sidewalls of said gate electrode after subjecting said substrate to a pre-amorphization implant.

7. The method of claim 6, wherein forming said sidewall spacer includes:

forming a sidewall spacer material layer over said gate electrode; and performing an anisotropic etch process to anisotropically etch said sidewall spacer material layer in order to provide said sidewalls spacer, wherein said pre-amorphization implant blocking material is removed by said anisotropic etch process.

8. The method of claim 6, further comprising implanting a dopant into said source/drain regions and using said sidewall spacer as a mask for generating a desired dopant profile in said source/drain regions.

9. The method of claim 6, wherein the sidewall spacer is separated from said gate electrode and said source/drain region by an intermediate liner.

10. The method of claim 6, said sidewall spacer inducing an intrinsic stress in a channel region below said gate electrode.

11. The method of claim 6, further comprising forming a stress-inducing layer over said transistor, said stress-inducing layer inducing a stress in a channel region below said gate electrode.

12. The method of claim 11, wherein the stress-inducing layer is a dielectric contact layer or an etch stop layer.

13. The method of claim 11, further comprising removing said sidewall spacer from said gate electrode before forming said stress-inducing layer.

14. The method of claim 1, wherein said source/drain regions comprise a stress-inducing region inducing a stress a channel region of said transistor below the gate electrode.

15. The method according to claim 1, wherein said substrate comprises gate electrodes of an N type transistor and a P type transistor, with said pre-amorphization implant blocking material over said gate electrodes of said N type transistor and said P type transistor.

16. The method according to claim 1, wherein:

said gate electrode is a gate electrode of a first transistor;

said source/drain regions being source/drain regions of a first transistor;

said substrate having a gate electrode of a second transistor being free of said pre-amorphization implant blocking material;

said substrate having source/drain regions of said second transistor, said source/drain regions of said second transistor being free of said pre-amorphization implant blocking material; and subjecting said substrate to a pre-amorphization implant comprises subjecting said substrate to the pre-amorphization implant to thereby pre-amorphize at least part of said source/drain regions of said first transistor and said second transistor, pre-amorphize at least part of said gate electrode of said second transistor and maintain said gate electrode of said first transistor without pre-amorphization.

17. The method of claim 16, wherein one of said first transistor and said second transistor is an N-type transistor and the other of said first transistor and said second transistors is a P-type transistor.

18. A method, comprising selectively pre-amorphizing source/drain regions of first and second transistors and a gate electrode of said second transistor while preventing pre-amorphization of a gate electrode of said first transistor.

19. The method of claim 6, wherein said sidewall spacer is removed prior to forming said cover layer.

20. A method, comprising:

providing a substrate;

said substrate having a gate electrode of a transistor with a pre-amorphization implant blocking material over said gate electrode;

said substrate having source/drain regions of said transistor that are free of said pre-amorphization implant blocking material;

subjecting said substrate to a pre-amorphization implant process to thereby pre-amorphize at least part of said source/drain regions while blocking said gate electrode from said pre-amorphization implant process;

forming a sidewall spacer at sidewalls of said gate electrode after subjecting said substrate to said pre-amorphization implant process;

implanting a dopant into said source/drain regions and using said sidewall spacer as a mask for generating a desired dopant profile in said source/drain regions;

removing said sidewall spacer from said gate electrode; and forming a stress-inducing layer over said transistor after removing said sidewall spacer, said stress-inducing layer inducing a stress in a channel region below said gate electrode.

21. The method of claim 20, wherein providing said substrate comprises:

providing said substrate having a gate insulating layer;

forming said gate electrode material layer over said gate insulating layer;

forming said pre-amorphization implant blocking material over said gate electrode material layer; and patterning said pre-amorphization implant blocking material and said gate electrode material layer so as to provide said gate electrode with said pre-amorphization implant blocking material over said gate electrode.

22. The method of claim 21, wherein patterning said pre-amorphization implant blocking material comprises:

forming a mask over said pre-amorphization implant blocking material, said mask being positioned above said gate electrode; and removing said pre-amorphization implant blocking material and said gate electrode material layer in regions not covered by said mask so as to provide said gate electrode with said pre-amorphization implant blocking material over said gate electrode and said mask over said pre-amorphization implant blocking material.

23. The method of claim 20, further comprising annealing said source/drain regions after implanting said dopant.

24. The method of claim 23, further comprising:

removing said pre-amorphization implant blocking material; and forming a metal silicide over each of said source/drain regions and said gate electrode.

25. The method of claim 20, wherein forming said sidewall spacer includes:

forming a sidewall spacer material layer over said gate electrode; and performing an anisotropic etch process to anisotropically etch said sidewall spacer material layer in order to provide said sidewalls spacer, wherein said pre-amorphization implant blocking material is removed by said anisotropic etch process.

26. The method of claim 20, wherein the sidewall spacer is separated from said gate electrode and said source/drain region by an intermediate liner.

27. The method of claim 20, wherein the stress-inducing layer is a dielectric contact layer or an etch stop layer.

28. A method, comprising:

providing a substrate comprising a first gate electrode and first source/drain regions of a first transistor, said first gate electrode having a pre-amorphization implant blocking material formed thereabove, said substrate further comprising a second gate electrode and second source/drain regions of a second transistor; and performing a pre-amorphization implant process on said substrate to pre-amorphize said second gate electrode and at least part of said first and second source/drain regions, wherein said implant blocking material prevents pre-amorphization of said first gate electrode.

29. The method of claim 28, wherein said first transistor is an N-type transistor and said second transistor is a P-type transistor.

* * * * *